(12) United States Patent
Rothman

(10) Patent No.: US 8,513,704 B2
(45) Date of Patent: Aug. 20, 2013

(54) METHOD FOR MANUFACTURING A PHOTODIODE AND CORRESPONDING PHOTODIODE AND ELECTROMAGNETIC RADIATION DETECTOR

(75) Inventor: Johan Rothman, Lans en Vercors (FR)

(73) Assignee: Commissariat a l'Energie Automique et aux Energies Alternatives (FR)

( * ) Notice: Subject to any disclaimer, the term of this patent is extended or adjusted under 35 U.S.C. 154(b) by 2 days.

(21) Appl. No.: 13/174,061

(22) Filed: Jun. 30, 2011

(65) Prior Publication Data

US 2011/0260277 A1    Oct. 27, 2011

Related U.S. Application Data

(63) Continuation of application No. PCT/FR2010/050112, filed on Jan. 26, 2010.

(30) Foreign Application Priority Data

Jan. 29, 2009    (FR) ...................................... 09 50545

(51) Int. Cl.
*H01L 31/107*    (2006.01)
*H01L 21/20*    (2006.01)

(52) U.S. Cl.
USPC .............. 257/186; 257/21; 257/291; 438/91; 438/389

(58) Field of Classification Search
USPC .................. 257/21, 186, 291; 438/91, 389
See application file for complete search history.

(56) References Cited

U.S. PATENT DOCUMENTS

| | | | | |
|---|---|---|---|---|
| 3,886,587 A | * | 5/1975 | Nicolay ........................ | 257/443 |
| 5,512,763 A | * | 4/1996 | Allam ............................ | 257/21 |
| 5,747,864 A | * | 5/1998 | Kitatani et al. ................ | 257/458 |
| 7,619,240 B2 | * | 11/2009 | Rothman ........................ | 257/21 |
| 7,795,639 B2 | * | 9/2010 | Rothman ........................ | 257/186 |
| 7,928,483 B2 | * | 4/2011 | Murakoshi et al. ........... | 257/291 |
| 2008/0067620 A1 | * | 3/2008 | Rothman ....................... | 257/438 |

FOREIGN PATENT DOCUMENTS

EP    1903612 A1    3/2008

OTHER PUBLICATIONS

International Preliminary Report on Patentability & Written Opinion of the International Searching Authority; Application No. PCT/FR2010/050112; Issued: Aug. 9, 2011; 10 pages.
International Search Report; Application No. PCT/FR2010/050112; Issued: Apr. 27, 2010; Mailing Date: May 10, 2010; 2 pages.
Razeghi, et al.; "Recent advances in LWIR Type—II InAs/GaSb superlattice photodetectors and focal plane arrays at the Center for Quantum Devices"; published in Proc. SPIE (vol. 6940 pp. 1 to 12), May 5, 2008.

* cited by examiner

*Primary Examiner* — Jarrett Stark
*Assistant Examiner* — Nicholas Tobergte
(74) *Attorney, Agent, or Firm* — St. Onge Steward Johnston & Reens LLC

(57) ABSTRACT

A photodiode capable of interacting with incident photons includes at least: a stack of three layers including an intermediate layer placed between a first semiconductor layer and a second semiconductor layer having a first conductivity type; and a region that is in contact with at least the intermediate layer and the second layer and extends transversely relative to the planes of the three layers, the region having a conductivity type that is opposite to the first conductivity type. The intermediate layer is made of a semiconductor material having a second conductivity type and is capable of having a conductivity type that is opposite to the second conductivity type so as to form a P-N junction with the region, inversion of the conductivity type of the intermediate layer being induced by dopants of the first conductivity type that are present in the first and second layers.

14 Claims, 3 Drawing Sheets

METHOD FOR MANUFACTURING A PHOTODIODE AND CORRESPONDING PHOTODIODE AND ELECTROMAGNETIC RADIATION DETECTOR

CROSS-REFERENCE TO RELATED APPLICATIONS

The present application is a continuation of pending International Patent Application No. PCT/FR2010/050112 filed on Jan. 26, 2010 which designates the United States and claims priority from French Patent Application No. 0950545 filed on Jan. 29, 2009, the content of which is incorporated herein by reference.

FIELD OF THE INVENTION

The invention relates to the field of photodiodes that are capable of interacting with incident photons, especially if they operate with zero or reverse bias, and to the field of electromagnetic radiation detectors.

BACKGROUND OF THE INVENTION

A photodiode is a semiconductor component comprising a P-N type junction and having, in particular, the ability to detect radiation in the optical spectrum and convert it into an electrical signal. Photodiodes with reverse bias are used, for example, to detect and measure incident photon fluxes.

Reverse biasing a photodiode actually makes it possible to accelerate free charge carriers due to the effect of an electric field applied in the depletion zone located between n-type doped layers and p-type doped layers. The free charge carriers can acquire sufficient energy to create additional electron-hole pairs. If the reverse bias is sufficient, this produces an avalanche effect, i.e. multiplication of the number of photo-carriers starting with a small number of initial photocarriers.

The so-called avalanche photodiode can be used, in particular, to detect incident photon fluxes relatively sensitively and quickly and offers various possible applications including implementing detection focal-planes for active imaging, high-speed detection in the field of telecommunications, spectroscopy, detecting very weak luminous fluxes and even photon counting.

Improving the operating parameters of an avalanche photodiode produces the following results in particular:
- amplification of weak currents as well as a low electronic noise factor in order to ensure a good signal-to-noise ratio;
- minimisation of the dark current that flows through the avalanche photodiode and contributes towards degradation of the signal-to-noise ratio;
- an increase in avalanche gain; and
- a reduction in the bias voltage.

Document EP 1 903 612 proposes a photodiode that has the particular advantage of having a relatively small dark current as well as high gain with low reverse bias without degrading the signal-to-noise ratio of the detector which uses it, especially when detecting infrared radiation. This photodiode comprises a stack of semiconductor layers having a first conductivity type and a region that extends transversely relative to the planes of the layers and having a conductivity type opposite to the first conductivity type so as to form a P-N junction with the stack.

However, this photodiode does not offer very good performance. In fact, despite having an acceptable sensitivity and response time, it may be necessary to provide cooling for the photodiode, especially when it is used at high temperature, because of the extrinsic doping of the stacked layers. In addition, the dark current increases as the operating temperature of the photodiode rises, thereby limiting the sensitivity of the photodiode when operating at high temperatures.

Also, to the extent that it is difficult to achieve perfectly pure crystals, a doped semiconductor material contains not only extrinsic dopants, i.e. those associated with the deliberately incorporated impurities, but also residual dopants that are associated with intrinsic defects, for example structural defects or chemical impurities which cannot be eliminated when manufacturing the material. The presence of these two types of defects causes recombination in materials, diminishes the lifetime of the minority carriers, which is already shortened by the Auger effect, and contributes towards the dark current, especially when the photodiode is used at a high temperature.

In order to overcome this background, the object of the present invention is to propose a photodiode that is free of at least one of the above-mentioned limitations. More especially, the object of the present invention is to improve the performance of the photodiode according to the prior art and, in particular, to propose a photodiode capable of capturing infrared radiation at high temperatures.

SUMMARY OF THE INVENTION

To this end, the invention relates to a method for manufacturing a photodiode capable of interacting with incident photons and consisting at least:
- in producing a stack of three semiconductor layers comprising an intermediate layer placed between a first lower layer and a second upper layer, the three layers having a first conductivity type; and
- in producing a semiconductor region that is in contact with at least the intermediate layer and the second upper layer and extends transversely relative to the planes of the three layers, said region having a second conductivity type opposite to the first conductivity type so as to form a P-N junction with the intermediate layer.

According to the invention:
- the intermediate layer is made of a semiconductor material having the second conductivity type; and
- the thickness of the intermediate layer and the dopant concentrations of the first and second layers and of the intermediate layer are selected so as to obtain inversion of the conductivity type of the intermediate layer from the second conductivity type to the first conductivity type being induced by the dopants of the first conductivity type that are present in the first and second layers.

For example, the first conductivity type is type P and the second conductivity type is type N.

In other words, the presence of charge carriers of the first type in the intermediate layer is induced exclusively by the dopants of the first conductivity type that are present in the first and second layers, especially when the photodiode is zero biased or reverse biased. The intermediate layer of the photodiode therefore undergoes modulation doping or inversion of its conductivity type, i.e. the intermediate layer made of a semiconductor of the second conductivity type no longer has the second conductivity type but the first conductivity type. Also, modulation doping has the particular advantage of increasing the mobility of the charge carriers and hence the sensitivity of the photodiode.

In one embodiment of the invention, said region extends partially into the interaction layer which consists, in particular, of said first layer.

The first and second layers can be made of extrinsic semiconductor materials of the first conductivity type, i.e. materials containing deliberately incorporated dopants of the first conductivity type.

The intermediate layer can be made of an extrinsic semiconductor with dopants of the second conductivity type.

The intermediate layer may also be made of a semiconductor material that is not intentionally doped and comprises residual dopants of the second conductivity type.

The concentration of dopants of the second type in the intermediate layer, before modulation doping, is preferably less than the concentration of dopants in the first and second layers.

The residual dopants are associated with intrinsic defects or impurities that cannot be eliminated when manufacturing the semiconductor material. An extrinsic semiconductor, i.e. a deliberately doped semiconductor, may therefore contain intrinsic defects associated with residual dopants and extrinsic defects associated with deliberately incorporated dopants. Using a semiconductor that is not intentionally doped for the intermediate layer associated with the modulation doping therefore makes it possible to dope the intermediate layer with charge carriers of the first conductivity type without any extrinsic defects due to deliberate doping. The intermediate layer can thus be doped with dopants having the first conductivity type without being affected by defects associated with extrinsic doping.

Advantageously, the thickness of the intermediate layer is less than the respective thicknesses of the first and second layers.

The small thickness of the intermediate layer makes it possible to facilitate its modulation doping, i.e. the transfer of free carriers (especially dopants of the first conductivity type) from the first and second layers into the intermediate layer in order to produce inversion of the intermediate layer's conductivity type. A P-N junction can thus be formed, especially when a zero potential difference is applied between the anode and the cathode, the anode being formed, for example, by an electrically conductive material that is in contact with the first layer and/or the second layer and the cathode being formed, for example, by another electrically conductive material that is in contact with the distinctive region of the invention. In addition, the small thickness of the intermediate layer also makes it possible to limit the dark current and interaction with interfering radiation.

In another embodiment, the semiconductor materials used to form the three stacked layers can be alloys of cadmium (Cd), mercury (Hg) and tellurium (Te) having the general formula $Cd_xHg_{1-x}Te$, where x is a value from 0 to 1 that represents the mole fraction of cadmium in the composition of the alloy. Such an alloy makes it possible to produce a photodiode with a low noise factor and low dark current, but with considerable multiplication gain at low bias.

The first and second layers may each have:
  a concentration of dopants of the first conductivity type of $10^{15}$ cm$^{-3}$ to $10^{17}$ cm$^{-3}$;
  a thickness of 0.5 to 2 micrometers; and
  a mole fraction x of 0.3 to 0.8.

The intermediate layer may have:
  a concentration of dopants of the second conductivity type of $10^{14}$ cm$^{-3}$ to $10^{15}$ cm$^{-3}$;
  a thickness of 0.1 to 1 micrometer; and
  a mole fraction x of 0.1 to 0.5, preferably a mole fraction of 0.2 to 0.3.

Semiconductor materials consisting of alloys of elements found in columns III and IV of the periodic table, for example an alloy of indium (In) and antimony (Sb) having the general formula InSb may also be used to form the three stacked layers.

The semiconductor materials used to form the three layers of the stack may also be type-2 superlattices based on semiconductors in columns III and IV of the periodic table. Type-2 superlattices based on III and IV semiconductors are superlattice heterostructures with alternate quantum wells for holes and electrons and make it possible to create a small bandgap by coupling to produce a material that cuts, for example 10 μm from materials having band gaps of around 1 μm, as described in the publication entitled "*Recent advances in LWIR Type-II InAs/GaSb superlattice photodetectors and focal plane arrays at the Center for Quantum Devices*" published in Proc. SPIE (vol. 6940 pages 1 to 12).

The object of invention is also a photodiode produced in accordance with the method stated above.

In one particular embodiment of the photodiode according to the invention:
  the first layer can be an interaction layer designed to interact with incident photons so as to generate photocarriers;
  the intermediate layer can be a photocarrier collection layer and may have a bandgap that is less than twice as wide as the respective bandgaps of the first and second layers;
  and, the second layer may be a confinement layer designed to confine photocarriers in the collection layer.

In another embodiment of the photodiode according to the invention:
  the intermediate layer may be both an interaction layer designed to interact with incident photons so as to generate photocarriers and a photocarrier collection layer, with the intermediate layer having a bandgap that is less than the width of the respective bandgaps of the first and second layers; and
  the first and second layers may be confinement layers designed to confine photocarriers in the collection layer.

In the above-mentioned embodiment, the dark current is reduced, as is the quantum efficiency (i.e. the ratio of absorbed photons to photons that are incident on the photodetector). Nevertheless, the dark current is sufficiently low to justify the loss in quantum efficiency and makes it possible to improve the structure's sensitivity.

Modulation doping produces a concentration of charge carriers of the first conductivity type in the intermediate layer that is lower than the concentration of charge carriers of the first conductivity type in the first and second layers. Because of this, the depletion zone in the intermediate layer is more extensive than the depletion zone in the first and second layers. This makes it possible to increase charge carrier confinement in the avalanche region.

To improve the sensitivity of the photodiode, it is possible to provide an optical cavity formed by first and second reflective surfaces located respectively either side of the stack.

In other words, the first and second reflective surfaces are placed on the front and rear faces of the structure respectively.

The first reflective surface can be a metallic mirror and the second reflective surface can be a distributed Bragg reflector.

In addition, the respective thicknesses of the first and second layers and the thickness of the region can be adjusted to maximize absorption in the intermediate layer over a precise wavelength range, thus improving the photodiode's sensitivity.

In practice, the confinement layer may be covered in a passivation layer.

Advantageously, a read contact is made so that it is in contact with the distinctive region of invention and is designed to transfer the electrical signals produced by photocarriers to an analysis circuit.

The invention also relates to an electromagnetic radiation detector comprising at least one photodiode as described above.

The invention thus makes it possible, in particular, to produce a photodiode capable of capturing infrared radiation and operating at high temperatures, typically at a temperature in excess of 200 K with a cut-off wavelength of 5 μm.

BRIEF DESCRIPTION OF THE DRAWINGS

Other aspects and advantages of the invention will become clearly apparent from the description given below, merely by way of example and not limitatively, which makes reference to the accompanying drawings in which.

DETAILED DESCRIPTION OF THE INVENTION

Figure 1:
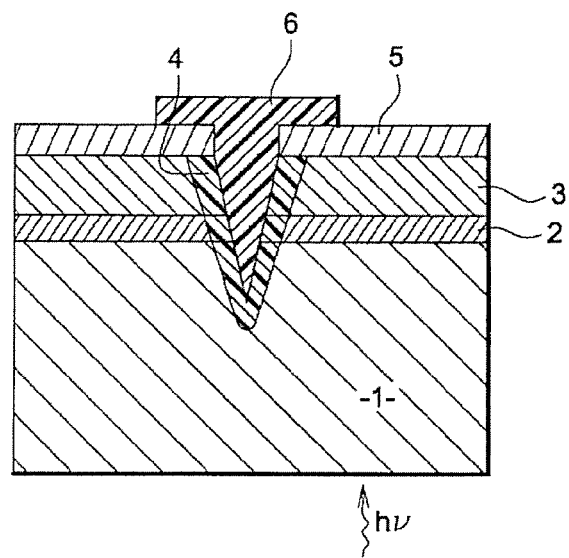
FIG. 1 is a schematic cross-sectional view of a photodiode in accordance with a particular embodiment of the invention.

FIG. 1 shows a photodiode according to one particular embodiment of the invention. It comprises:
- a stack of three layers, said stack comprising an intermediate layer 2 placed between a first semiconductor layer 1 and a second semiconductor layer 3 having a first conductivity type; and
- a region 4 that extends transversely relative to the planes of the three layers 1, 2, 3 and is in contact with at least intermediate layer 2 and second layer 3 and which has a conductivity type that is opposite to the first conductivity type.

Intermediate layer 2 is made of a semiconductor having a second conductivity type and is capable of having a conductivity type that is opposite to the second conductivity type so as to form a P-N junction with said region 4, inversion of the conductivity type of intermediate layer 2 being induced by dopants of the first conductivity type that are present in first and second layers 1, 3.

The concentration of dopants in layer 2 is less than the concentration of dopants in layers 1 and 3 in order to produce a modulation effect.

The semiconductor materials used to form the three stacked layers 1, 2, 3 can be alloys of cadmium (Cd), mercury (Hg) and tellurium (Te) having the general formula $Cd_xHg_{1-x}Te$, where x is a value from 0 to 1 that represents the mole fraction of cadmium in the composition of the alloy. Such an alloy makes it possible to produce a photodiode with a low noise factor and low dark current, but with considerable multiplication gain at low bias. The thickness of layer 1 is selected depending on the wavelength of the radiation to be detected.

The first and second layers 1, 3 are made of extrinsic semiconductor materials that each have:
- a concentration of dopants of the first conductivity type of $10^{15}$ cm$^{-3}$ to $10^{17}$ cm$^{-3}$;
- a thickness of 0.5 to 2 micrometers; and
- a mole fraction x of 0.3 to 0.8.

Intermediate layer 2 is made of a semiconductor material that is not intentionally doped and has:
- a concentration of dopants of the second conductivity type of $10^{14}$ cm$^{-3}$ to $10^{15}$ cm$^{-3}$;
- a thickness of 0.1 to 1 micrometer; and
- a mole fraction x of 0.1 to 0.5, preferably a mole fraction of 0.2 to 0.3.

In practice, the first conductivity type is type P and the second conductivity type is type N. Thus, the conductivity of intermediate layer 2 made of a semiconductor that is not intentionally doped is type N whereas the respective conductivities of first and second layers 1, 3 made of an intentionally doped semiconductor is type P.

Operations to produce region 4 are carried out conventionally and its shape is determined depending on the surface area of the P-N junction interface needed in order to collect photocarriers. Also, region 4 does not necessarily penetrate into first layer 1. Nevertheless, because of the inherent constraints of fabrication techniques, region 4 may penetrate slightly into first layer 1 in order to make certain that said region 4 passes through layer 2.

Figure 2:
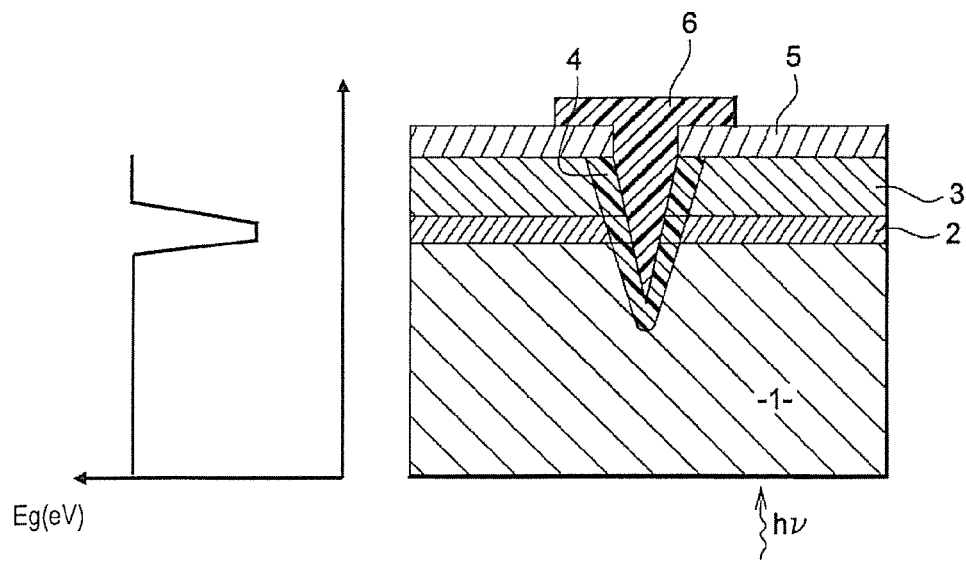
FIG. 2 is a schematic cross-sectional view of a photodiode according to FIG. 1 with, to the left of FIG. 2, a diagram showing the widths of the bandgaps of the various layers that constitute the photodiode.

In this particular embodiment, first layer 1 acts as an interaction layer and is designed to interact with incident photons of an electromagnetic radiation such as infrared radiation. This first layer 1 therefore preferably extends transversely or even at right angles to the direction of the incident photons that are to be detected. Intermediate layer 2 acts as a photocarrier collection layer and has a bandgap that is less than twice as wide as the respective bandgaps of first and second layers 1, 3, as shown in FIG. 2. This ensures confinement of charge carriers which acquire the necessary energy to produce the impact ionisation that is responsible for multiplication.

Second layer 3 acts as a confinement layer and is designed to confine photocarriers in the collection layer.

Figure 3:
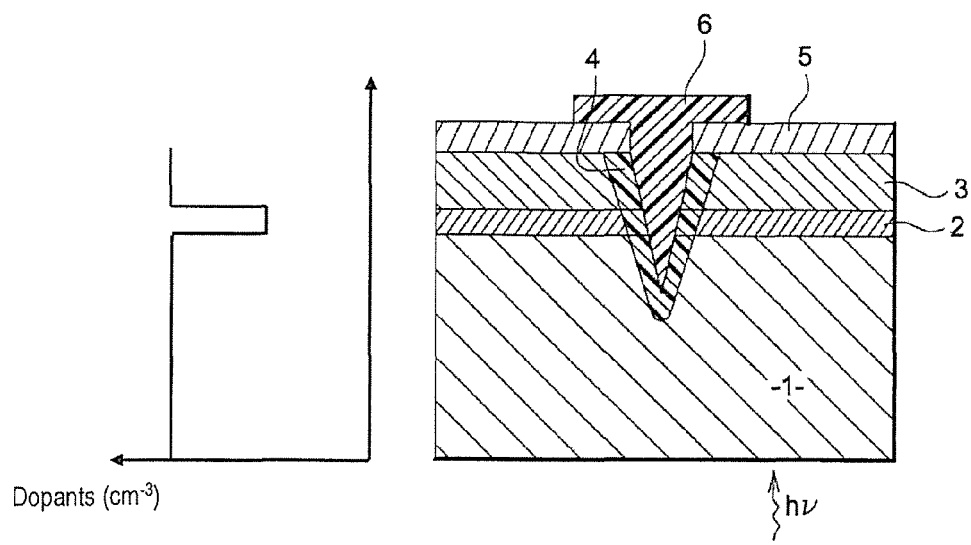
FIG. 3 is a schematic cross-sectional view of a photodiode according to FIG. 1 with, to the left of FIG. 3, a diagram showing the dopant concentrations in the various layers that constitute the photodiode.
Figure 4:
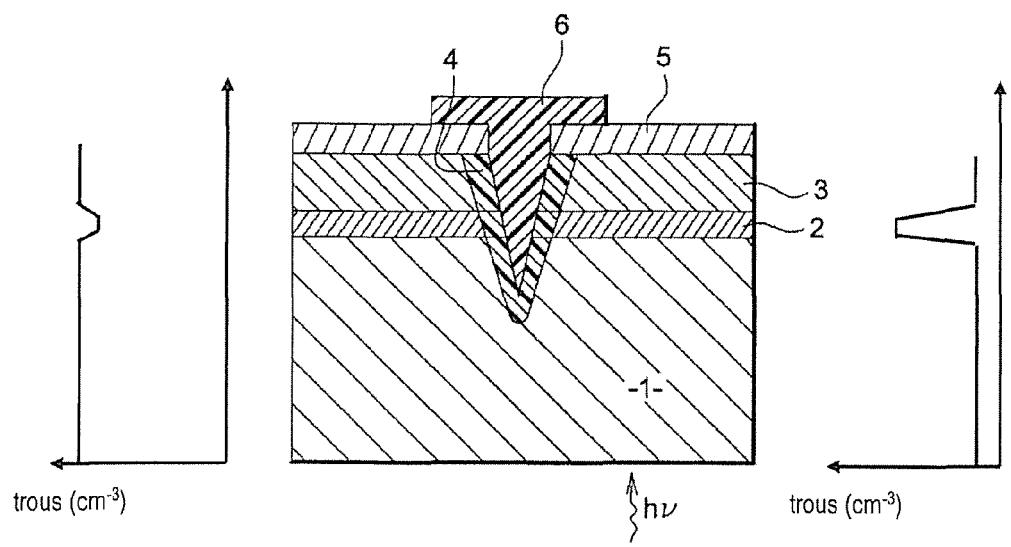
FIG. 4 is a schematic cross-sectional view of a photodiode according to FIG. 1 with zero bias and, to the left of FIG. 4, a diagram showing the hole concentration in the stacked layers and, to the right of FIG. 4, a diagram showing the hole concentration in the P-N junction.

The thickness of intermediate layer 2 is preferably less than the respective thicknesses of first and second layers 1, 3. The small thickness of intermediate layer 2 makes it possible to facilitate modulation doping of said intermediate layer 2, i.e. the transfer of free carriers (especially dopants of the first conductivity type (in this case holes)) from first and second layers 1, 3 into intermediate layer 2 in order to produce inversion of the conductivity type of intermediate layer 2, as shown in FIG. 3. A P-N junction can thus be formed, especially when a zero potential difference is applied between the anode and the cathode, the anode being formed, for example, by an electrically conductive material that is in contact with first layer 1 and/or second layer 3 and the cathode being formed, for example, by another electrically conductive material that is in contact with region 4. In addition, the small thickness of the intermediate layer also makes it possible to limit the dark current and interaction with interfering radiation.

The concentration of dopants of the second conductivity type (in this case type N) in intermediate layer 2 is referred to as "residual doping" and is associated with intrinsic defects or impurities that is difficult to eliminate during manufacture of the material. This residual doping is therefore always present. The modulation doping applied to intermediate layer 2 thus makes it possible to inverse the conductivity of intermediate layer 2 and give intermediate layer 2, which initially has conductivity type N, P type conductivity but without the defects associated with extrinsic doping. The doping of intermediate layer 2 is induced by the dopants that are present in the first and second layers 1, 3.

As shown in FIG. 3, the concentration of dopants of the second conductivity type in intermediate layer 2 is selected so that it is less than the concentrations of dopants of the first conductivity type in first and second layers 1, 3 respectively. Because of this, the depletion zone in intermediate layer 2 is made more extensive than the depletion zones in first and second layers 1, 3 and the avalanche gain and photocarrier confinement in intermediate layer 2 are increased. Moreover, when the photodiode is reverse-biased, the number of minority carriers decreases and causes suppression of the "Auger generation effect". This way, the dark current generated outside the depletion zone will also be reduced when the device is used at high operating temperatures. Quantum efficiency is also reduced. Nevertheless, the dark current is sufficiently low to justify the loss in quantum efficiency and makes it possible to improve the structure's sensitivity.

Modulation doping produces a concentration of charge carriers of the first conductivity type in the intermediate layer that is lower than the concentration of charge carriers of the first conductivity type in the first and second layers. Because of this, the depletion zone in the intermediate layer is more extensive than the depletion zone in the first and second layers. This makes it possible to increase charge carrier confinement in the avalanche region.

In practice, second layer 3 that acts as a confinement layer may be covered in passivation layer 5 which is electrically neutral. This passivation layer is made of an insulating material such as ZnS for example. Region 4 is placed in contact with an electrically conducting material intended to form a contact 6, for example a read contact, in order to transfer the electrical signals generated by the photocarriers collected in the P-N junction to the analysis circuit of the detector (not shown). The material which constitutes read plot 6 is in electrical contact with the material which forms region 4 but it is isolated from confinement layer 3 by passivation layer 5.

Thus, the photocarriers released by interactions between incident rays and the interaction layer (in this case first layer 1) are multiplied due to the avalanche effect because of the narrowness of the bandgap of the collection layer (in this case intermediate layer 2). In fact, with the same reverse bias voltage, multiplication of photocarriers in the depletion zones of the P-N junctions located between region 4 and each of first and second layers 1, 3 is negligible because of the larger width of the bandgap of these layers. Consequently, the majority of the photocarriers are multiplied by the P-N junction located between region 4 and the collection layer (in this case intermediate layer 2). Also, because the depletion zone of the intermediate layer is more extensive, carrier confinement in intermediate layer 2 is accentuated and will reduce the probability of carriers escaping from the intermediate layer, thus improving the structure's gain.

Figure 5:
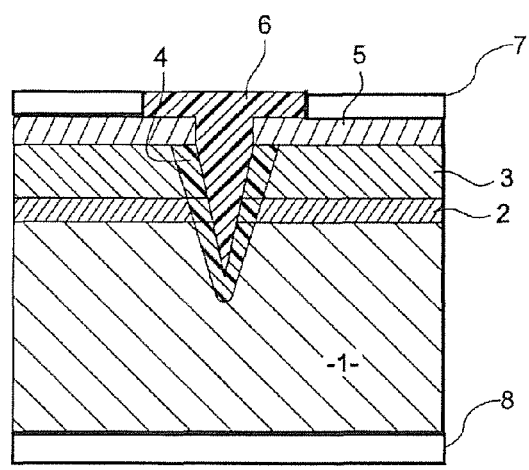
FIG. 5 is a schematic cross-sectional view of a photodiode in accordance with another particular embodiment of the invention.

To improve the sensitivity of the photodiode, it is possible to provide an optical cavity formed by first and second reflective surfaces 7, 8 located respectively either side of the stack, i.e. on the front and rear faces of the photodiode, as shown in FIG. 5. The first reflective surface 7 can be a metallic mirror and the second reflective surface 8 can be a distributed Bragg reflector, with the reflective faces of both mirrors being placed opposite each other.

Semiconductor materials consisting of alloys of elements found in columns III and IV of the periodic table, for example an alloy of indium (In) and antimony (Sb) having the general formula InSb may also be used to form the three stacked layers.

The semiconductor materials used to form the three layers of the stack may also be type-2 superlattices based on semiconductors in columns III and IV of the periodic table. Type-2 superlattices based on semiconductors III and V are superlattice heterostructures with alternate quantum wells for holes and electrons that make it possible to create a small bandgap by coupling the states of the holes and the electrons that are confined in each well. This makes it possible to produce a material that cuts, for example 10 µm from materials having bandgaps of around 1 µm, as described in the publication entitled "Recent advances in LWIR Type-II InAs/GaSb superlattice photodetectors and focal plane arrays at the Center for Quantum Devices" published in Proc. SPIE (vol. 6940 pages 1 to 12).

In another embodiment of the invention:
the intermediate layer may be both an interaction layer designed to interact with incident photons so as to generate photocarriers and a photocarrier collection layer, with the intermediate layer having a bandgap that is less than the width of the respective bandgaps of the first and second layers; and
the first and second layers may be confinement layers designed to confine photocarriers in the collection layer.

In this embodiment, radiation is detected in the intermediate layer. With such a structure, the dark current is reduced, as is the quantum efficiency (i.e. the ratio of absorbed photons to photons that are incident on the photodetector). Nevertheless, in particular because the Auger effect is suppressed, the reduction in the dark current is greater than the reduction in the quantum efficiency, thereby improving the structure's sensitivity.

The photodiode described above can be used to capture infrared radiation and can operate at high temperatures. The photodiode can operate as a single sensor or may form an elementary sensor within a detection array.

What is claimed is:

1. A method for manufacturing a photodiode capable of interacting with incident photons, comprising at least the steps of:
    producing a stack of three semiconductor layers comprising an intermediate layer placed between a first lower layer and a second upper layer, the three layers having a first conductivity type; and
    producing a semiconductor region that is in contact with at least said intermediate layer and said second upper layer and extends transversely relative to the planes of the three layers, said region having a second conductivity type opposite to the first conductivity type so as to form a P-N junction with said intermediate layer,
    wherein the intermediate layer is made of a semiconductor material having the second conductivity type;
    and wherein a thickness of said intermediate layer and the dopant concentrations of the first and second layers and of the intermediate layer are selected so as to obtain inversion of the conductivity type of said intermediate layer from the second conductivity type to the first conductivity type induced by the dopants of the first conductivity type that are present in the first and second layers.

2. The method for manufacturing a photodiode of claim 1, wherein the intermediate layer has a thickness that is less than respective thicknesses of the first and second layers.

3. The method for manufacturing a photodiode of claim 1, wherein the intermediate layer is made of a semiconductor material, comprising dopants of the second conductivity type, with a concentration of dopants of the second conductivity type in said intermediate layer being lower than concentrations of dopants of the first conductivity type in the first and second layers respectively.

4. The method for manufacturing a photodiode of claim 1, wherein the semiconductor materials used to form the three layers of the stack are alloys of cadmium, mercury and tellurium having the general formula $Cd_xHg_{1-x}Te$, where x is a value from 0 to 1 and represents a mole fraction of cadmium in the composition of the alloy.

5. The method for manufacturing a photodiode of claim 4, wherein the first and second layers each have:
- a concentration of dopants of the first conductivity type of $10^{15}$ cm$^{-3}$ to $10^{17}$ cm$^{-3}$;
- a thickness of 0.5 μm to 2 μm; and
- a mole fraction x of 0.3 to 0.8;

and wherein the intermediate layer has:
- a concentration of dopants of the second conductivity type of $10^{14}$ cm$^{-3}$ to $10^{15}$ cm$^{-3}$;
- a thickness of 0.1 μm to 1 μm; and
- a mole fraction x of 0.1 to 0.5.

6. A photodiode capable of interacting with incident photons, comprising at least:
- a stack of three semiconductor layers comprising an intermediate layer placed between a first lower layer and a second upper layer, the three layers having a first conductivity type; and
- a semiconductor region that is in contact with at least said intermediate layer and said second upper layer and extends transversely relative to the planes of the three layers, said region having a second conductivity type opposite to the first conductivity type so as to form a P-N junction with intermediate layer, wherein:
- the intermediate layer is made of a semiconductor material having the second conductivity type;
- the thickness of said intermediate layer and the dopant concentrations of the first and second layers and of the intermediate layer are selected so as to obtain inversion of the conductivity type of intermediate layer from the second conductivity type to the first conductivity type induced by the dopants of the first conductivity type that are present in the first and second layers.

7. The photodiode of claim 6,
wherein the first layer is an interaction layer designed to interact with incident photons so as to generate photocarriers;
wherein the intermediate layer is a photocarrier collection layer and has a bandgap that is less than each of respective bandgaps of the first and second layers;
and wherein the second layer is a confinement layer designed to confine photocarriers in the collection layer.

8. The photodiode of claim 6,
wherein the intermediate layer is both an interaction layer designed to interact with incident photons so as to generate photocarriers and a photocarrier collection layer, said intermediate layer having a bandgap that is less than a width of respective bandgaps of the first and second layers;
and wherein the first and second layers are confinement layers designed to confine photocarriers in the collection layer.

9. The photodiode of claim 6, wherein the photodiode further comprises an optical cavity formed by a first reflective surface and a second reflective surface placed respectively on either side of the stack.

10. The photodiode of claim 9, wherein the first reflective surface is a metallic mirror and the second reflective surface is a distributed Bragg reflector.

11. The photodiode of claim 6, wherein said semiconductor region extends partially into the first interaction layer.

12. The photodiode of claim 6, wherein the second layer is covered by a passivation layer.

13. An electromagnetic radiation detector comprising at least one photodiode of claim 6.

14. The method for manufacturing a photodiode of claim 5 wherein the intermediate layer has a mole fraction x of 0.2 to 0.3.

* * * * *